US012676535B2

(12) United States Patent
Choi et al.

(10) Patent No.: US 12,676,535 B2
(45) Date of Patent: Jul. 7, 2026

(54) AIR COMPRESSOR

(71) Applicant: Hanon Systems, Daejeon (KR)

(72) Inventors: Kyu Sung Choi, Daejeon (KR); Gun Woong Park, Daejeon (KR); Chi Yong Park, Daejeon (KR); Yeol Woo Sung, Daejeon (KR); Hyun Sup Yang, Daejeon (KR)

(73) Assignee: HANON SYSTEMS, Daejeon (KR)

( * ) Notice: Subject to any disclaimer, the term of this patent is extended or adjusted under 35 U.S.C. 154(b) by 352 days.

(21) Appl. No.: 18/276,900

(22) PCT Filed: Apr. 11, 2022

(86) PCT No.: PCT/KR2022/005180
§ 371 (c)(1),
(2) Date: Aug. 11, 2023

(87) PCT Pub. No.: WO2022/220510
PCT Pub. Date: Oct. 20, 2022

(65) Prior Publication Data
US 2024/0120813 A1 Apr. 11, 2024

(30) Foreign Application Priority Data

Apr. 12, 2021 (KR) ........................ 10-2021-0047421
Apr. 6, 2022 (KR) ........................ 10-2022-0042760

(51) Int. Cl.
*H02K 11/33* (2016.01)
*F04D 25/06* (2006.01)
(Continued)

(52) U.S. Cl.
CPC ............. *H02K 11/33* (2016.01); *F04D 25/06* (2013.01); *F04D 29/4206* (2013.01);
(Continued)

(58) Field of Classification Search
CPC .... H02K 11/33; H02K 11/02; H02K 2211/03; F04D 25/06; F04D 29/4206;
(Continued)

(56) References Cited

U.S. PATENT DOCUMENTS 3,014,977 A * 12/1961 Geiser .................. H01R 11/289
439/957
2012/0330382 A1 * 12/2012 Makdissi ............. A61N 1/0587
607/62
(Continued)

FOREIGN PATENT DOCUMENTS

JP 2012152104 A * 8/2012
JP 2015229994 A 12/2015
(Continued)

OTHER PUBLICATIONS

International Search Report issued in PCT/KR2022/005180 on Jun. 30, 2022.
(Continued)

*Primary Examiner* — Thomas Fink
(74) *Attorney, Agent, or Firm* — NORTON ROSE FULBRIGHT US LLP

(57) ABSTRACT

Air compressor in which the arrangement structure between a filter part and a discharge resistor reduces interference between the filter part and the discharge resistor and increases the space utilization of the filter part, making the air compressor more compact. The air compressor comprises a housing with a rotary shaft disposed inside it; a compression part connected to the rotary shaft which compresses and discharges introduced air; a motor part driving the rotary shaft; a control board for controlling the motor part, and the filter part which filters noise of external power and supplies the external power to the control board, wherein the filter part includes a capacitor assembly connected to an external power source, a transistor connected to the control board, a current sensor assembly connected to the transistor, and a discharge resistor connected to the capacitor assembly and discharges the residual charge in the capacitor assembly.

17 Claims, 16 Drawing Sheets

(51) Int. Cl.

| | |
|---|---|
| *F04D 29/42* | (2006.01) |
| *F04D 29/66* | (2006.01) |
| *H01M 8/04111* | (2016.01) |
| *H02K 11/02* | (2016.01) |
| *H03H 1/00* | (2006.01) |
| *B60L 50/70* | (2019.01) |

(52) U.S. Cl.
CPC ....... *F04D 29/661* (2013.01); *H01M 8/04111* (2013.01); *H02K 11/02* (2013.01); *H03H 1/0007* (2013.01); *B60L 50/70* (2019.02); *H02K 2211/03* (2013.01)

(58) Field of Classification Search
CPC .. F04D 29/661; F04D 25/068; H01M 8/0411; B60L 50/70; H03H 1/0007
See application file for complete search history.

(56) References Cited

U.S. PATENT DOCUMENTS

| | | | |
|---|---|---|---|
| 2015/0061558 A1 | 3/2015 | Yano et al. | |
| 2016/0016475 A1* | 1/2016 | Toda ................... | H01L 23/3677 318/400.26 |
| 2018/0159403 A1 | 6/2018 | Yokoyama et al. | |
| 2019/0345956 A1* | 11/2019 | Iizuka ................ | F04D 25/0606 |

FOREIGN PATENT DOCUMENTS

| | | |
|---|---|---|
| JP | 2020165324 A | 10/2020 |
| KR | 100962903 B1 | 6/2010 |
| KR | 102174638 B1 | 11/2020 |
| KR | 20210038116 A | 4/2021 |

OTHER PUBLICATIONS

Translation of Official Action issued Apr. 1, 2026 in related Chinese Patent Application No. 202280023062.7, 15 pgs.

* cited by examiner

800: 810, 820, 830

AIR COMPRESSOR

CROSS REFERENCE TO RELATED APPLICATIONS

This patent application is a national phase under 35 U.S.C. § 371 of International Patent Application No. PCT/KR2022/005180 filed Apr. 11, 2022, which claims the benefit of priority from Korean Patent Application Nos. 10-2021-0047421 filed Apr. 12, 2021, and 10-2022-0042760 filed Apr. 6, 2022, each of which is hereby incorporated herein by reference in its entirety for all purposes.

TECHNICAL FIELD

The present invention relates to an air compressor, and more particularly, to an air compressor integrally provided with a controller.

BACKGROUND ART

Generally, a fuel cell vehicle is a vehicle in which hydrogen and oxygen are supplied to a humidifier and electrical energy generated by an electrochemical reaction which is an electrolysis reverse reaction of water is supplied as driving force of the vehicle. A typical fuel cell vehicle was proposed in Korean Patent Registration No. 0962903.

Typically, fuel cell sedans are provided with an 80-kW fuel cell stack. In the case where a fuel cell stack is operated under pressurization conditions, high-pressure air ranging from 1.2 bar to 3.0 bar is supplied to the fuel cell stack. To this end, an air compressor which is operated at a speed of 5,000 rpm to 100,000 rpm is required to be used.

Fuel cell vehicles generally include a fuel cell stack configured to generate electricity, a humidifier configured to humidify fuel and air to be supplied to the fuel cell stack, a fuel supply unit configured to supply hydrogen to the humidifier, an air supply unit configured to supply air including oxygen to the humidifier, a cooling module configured to cool the fuel cell stack, and so forth.

The air supply unit includes an air cleaner configured to filter out foreign substances included in air, an air compressor configured to compress and supply air filtered by the air cleaner, and a control box configured to control the air compressor.

The above-mentioned air compressor compresses air sucked from the outside using an impeller and then discharges the compressed air to the fuel cell stack through a discharge port. In this case, the impeller and the shaft constituting the compression unit are driven by the rotational force of the motor.

The inverter supplies electric power to a motor of such an air compressor and controls the operation of the motor. The inverter includes a Printed Circuit Board (PCB) on which transistors, capacitors, inductors, and electrical components such as constant resistors, diodes, and drivers are mounted.

However, the conventional air compressor has a problem in that the space utilization between parts is poor, and as a result, assemblability of parts is poor, and miniaturization of the air compressor is limited.

In addition, a phenomenon in which the inside is overheated due to heat generated by constant flow of current while a high voltage current is applied occurs.

DOCUMENTS OF RELATED ART

Patent Document 1: Korean registered patent No. 0962903 (registered on Jun. 1, 2010)

DISCLOSURE

Technical Problem

The present invention has been devised to solve the problems described above, and an object thereof is to provide is to provide an air compressor that increases space utilization between parts and easily discharges internal heat.

The object to be solved by the present invention is not limited to the above object, and other objects described above will be clearly understood by those skilled in the art from the following description.

Technical Solution

An air compressor according to one aspect of the present invention comprises a housing; a rotary shaft disposed inside the housing; a compression part that is connected to the rotary shaft and compresses and discharges introduced air; a motor part that drives the rotary shaft; a control board that controls the motor part; and a filter part that filters noise of external power and supplies the external power to the control board, wherein the filter part includes a capacitor assembly connected to an external power source; a transistor connected to the control board; a current sensor assembly connected to the transistor; and a discharge resistor that is connected to the capacitor assembly and discharges residual charge in the capacitor assembly.

The air compressor further comprises a transfer module that transfers power from the control board to the motor part, wherein the discharge resistor is disposed adjacent to the transfer module, the transfer module includes a transfer unit extending outward in a radial direction from the motor part.

The capacitor assembly may include a capacitor; a case supporting the capacitor; and a resistor connection terminal connected to the discharge resistor, wherein the resistor connection terminal may be disposed on the capacitor.

The air compressor may comprise a first cover disposed to cover at least one side of the filter part; and a heat exchanging means disposed between the first cover and the transistor.

The current sensor assembly and the capacitor assembly may be disposed in a first direction perpendicular to an axial direction, the transistor may be disposed in a second direction perpendicular to the first direction with respect to the current sensor assembly and the capacitor assembly.

The air compressor may comprise at least one cooling flow channel disposed between the motor part and the filter part, wherein the discharge resistor may be disposed adjacent to the cooling flow channel.

The first cover may be disposed on an upper side of the transistor, and the discharge resistor may be disposed on an upper surface of the first cover.

The air compressor may comprise a fixing member coupled to the discharge resistor and disposed on the upper surface of the first cover to fix the discharge resistor to the first cover.

The discharge resistor may be disposed adjacent to the current sensor assembly.

The first cover may be disposed such that a width in a first direction is longer than a width in a second direction, the discharge resistor may be disposed such that the width in the first direction is longer than the width in the second direction.

One surface of the first cover to which the discharge resistor is fixed may be disposed lower than the resistor connection terminal.

An inner space of the housing may be divided into a first space in which the capacitor assembly is disposed and a second space in which the current sensor assembly is disposed, based on an imaginary line extending in an axial direction, and the discharge resistor may be disposed in the first space.

The discharge resistor may be disposed on a lower side of the case.

The air compressor may comprise a second cover disposed in the housing, wherein the second cover may include a first support part supporting the current sensor assembly and a second support part supporting the transfer unit.

The second support part may include a protruding part surrounding a portion of the transfer unit, and the housing may further include a through hole accommodating the protruding part.

The housing may further include a groove spaced apart from the through hole, a sealing may be disposed inside the groove. When the second cover is disposed inside the housing, an upper side of the groove and the sealing may be covered by the second cover.

The first cover may be made of at least one of aluminum, synthetic resin and steel.

The first cover and the heat exchanging means may be integrally provided.

Advantageous Effects

According to the embodiment, by improving the arrangement structure between the filter part and the discharge resistor, interference between the filter part and the discharge resistor can be reduced, and space utilization of the filter part can be increased to compact the air compressor.

In addition, overheating of the discharge resistor is prevented by arranging the discharge resistor on the upper surface of the cover or at a location where heat is easily discharged, and the problem of the temperature rising around the filter part can be solved.

MODE FOR INVENTION

Hereinafter, preferred embodiments of the present invention will be described in detail with reference to the accompanying drawings.

However, the technical spirit of the present invention is not limited to some embodiments to be described and may be implemented using various other embodiments, and one or more components of the embodiments may be selectively coupled, replaced, and used within the technical spirit of the present invention.

In addition, unless the context clearly defines and is specifically defined, terms (including technical and scientific terms) used herein may be interpreted to have meanings commonly understood by those skilled in the art, and meanings of commonly used terms such as terms defined in dictionaries will be interpreted as contemplating the context of the relevant art.

Furthermore, the terminology used in the embodiments of the invention is to be regarded as illustrative only and is not limiting of the invention.

In this specification, unless the context clearly indicates otherwise, the singular form includes the plural form, and where "at least one (or one or more) of A, B and C" is described, this may include at least one of all possible combinations of A, B and C.

Further, in the description of the components of the present invention, terms such as "first", "second", "A", "B", "(a)", and "(b)" may be used.

The terms are used merely to distinguish one element from another element, and the nature, order, etc. of the elements are not limited to these terms.

Furthermore, when an element is referred to as being "connected," "coupled," or "linked" to another element, such description can include instances where the element is directly connected or coupled to the other element as well as instances where the element is connected, coupled, or linked to the other element with the other element disposed therebetween.

In addition, when any one element is described as being formed or disposed "upper (on)" or "lower (under)" another element, such description includes both the case where two elements are formed or disposed in direct contact with each other and the case where one or more other elements are interposed between the two elements. In addition, when an element is described as being formed "upper (on) or lower (under)" another element, such description may include the case where the element is formed on the upper side or the lower side with respect to the other element.

Figure 1:
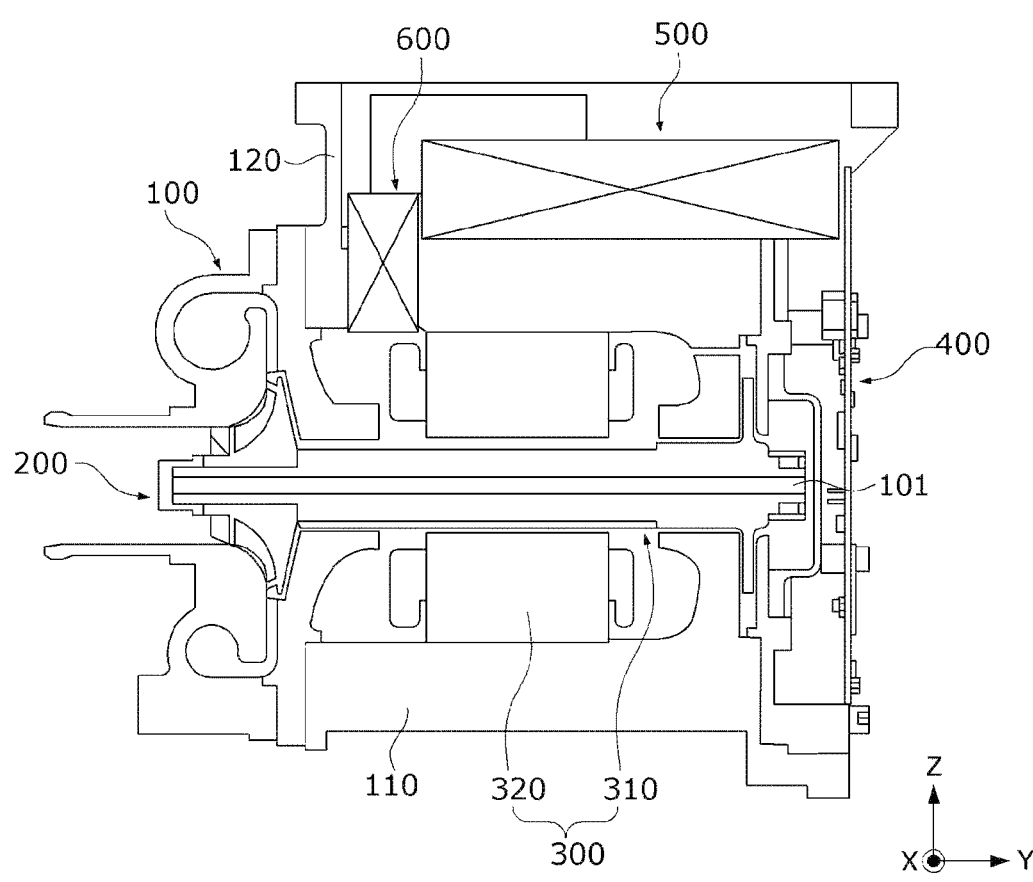
FIG. 1 is a schematic cross-sectional view of an air compressor according to an embodiment of the present invention.

FIG. 1 is a schematic cross-sectional view of an air compressor according to an embodiment of the present invention.

Referring to FIG. 1, the air compressor may include a housing 100, a compression part 200, a motor part 300, a control board 400, a filter part 500, and a transfer module 600.

The housing 100 may constitute the outside. The housing 100 may include a first housing 110 and a second housing 120. A rotary shaft 101, the compression part 200, and the motor part 300 may be disposed in the first housing 110. In addition, the second housing 120 may be provided with an accommodating part in which the filter part 500 is disposed. The first housing 110 and the second housing 120 may be integrally formed, but are not limited thereto.

The compression part 200 is disposed at the front side in the housing 100. In this case, the front side is disposed in a direction from the motor part 300 toward the compression part 200, and the rear side is disposed in a direction opposite to the direction toward the front side.

The motor part 300 is used to rotationally drive the rotatory shaft 110 to supply driving force to the compression part 200. In this case, the motor part 300 includes a rotor 310 and a stator 320. The stator 320 includes a driving coil, and the driving coil generates electromagnetic force when power is supplied from the outside. Accordingly, the rotor 310 may rotate due to electromagnetic interaction between the rotor 310 and the stator 320. Meanwhile, one side of the rotor 310 is connected to the compression part 200 to drive the compression part 200. In this case, the driving coil may be operated by receiving three-phase alternating current power.

The circuits and elements for controlling the motor part 300 are mounted on the control board 410. In this case, the control board 410 may be a Printed Circuit Board (PCB). The control board 410 may be disposed on the rear side of the rotatory shaft 101 and the motor part 300, and may be spaced apart from the rear end of the rotatory shaft 101. In this case, the control board 410 is formed in the shape of a board, and the thickness direction of the control board 410 may be disposed to face the axial direction of the rotatory shaft 101.

The filter part 500 receives external power and supplies the external power to the control board 400 in a state where noise of the power is removed. In this case, the filter part 500 may be disposed outside the motor part 300 in the radial direction.

The transfer module 600 transfers power from the control board 400 to the motor part 300. In this case, the power may pass through the filter part 500 and then transferred to the motor part 300 through the transfer module 600. The transfer module 600 may transfer the three-phase AC voltage converted in the filter part 500 to the motor part 300. The transfer module 600 may include a busbar or a wire, and may include any means capable of transferring power to the motor part 300.

Figure 2:
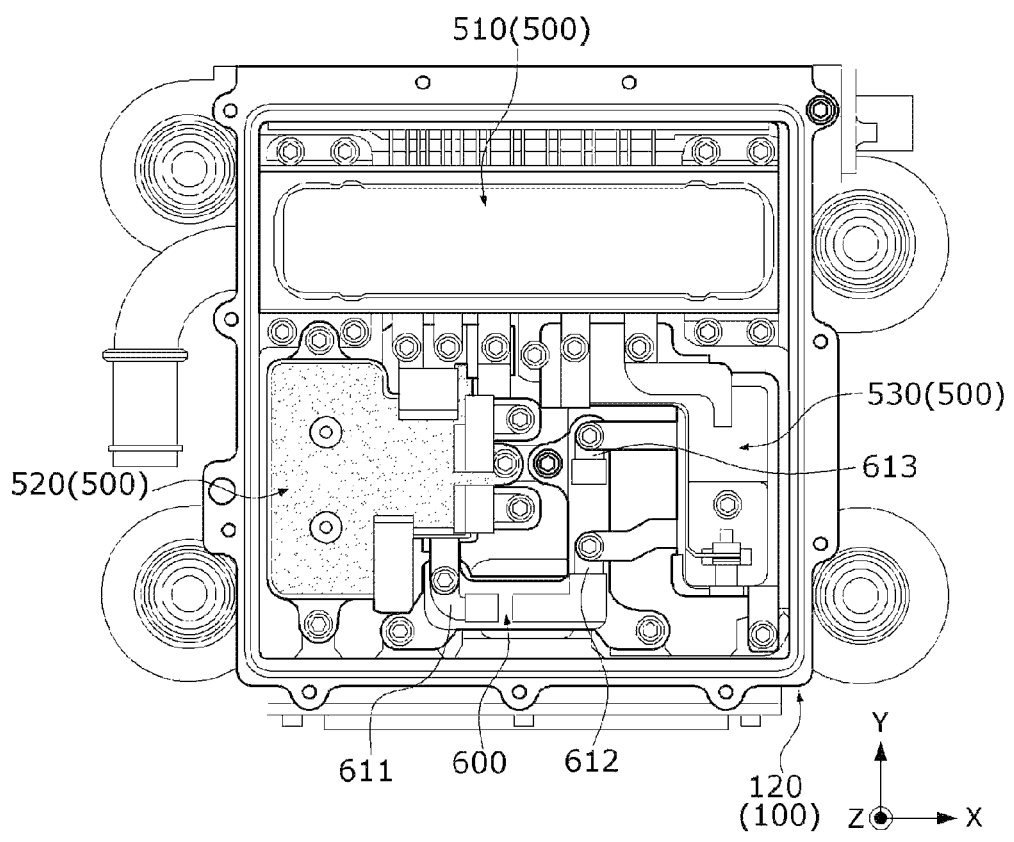
FIG. 2 is a plan view of a housing and a filter part according to an embodiment of the present invention.
Figure 3:
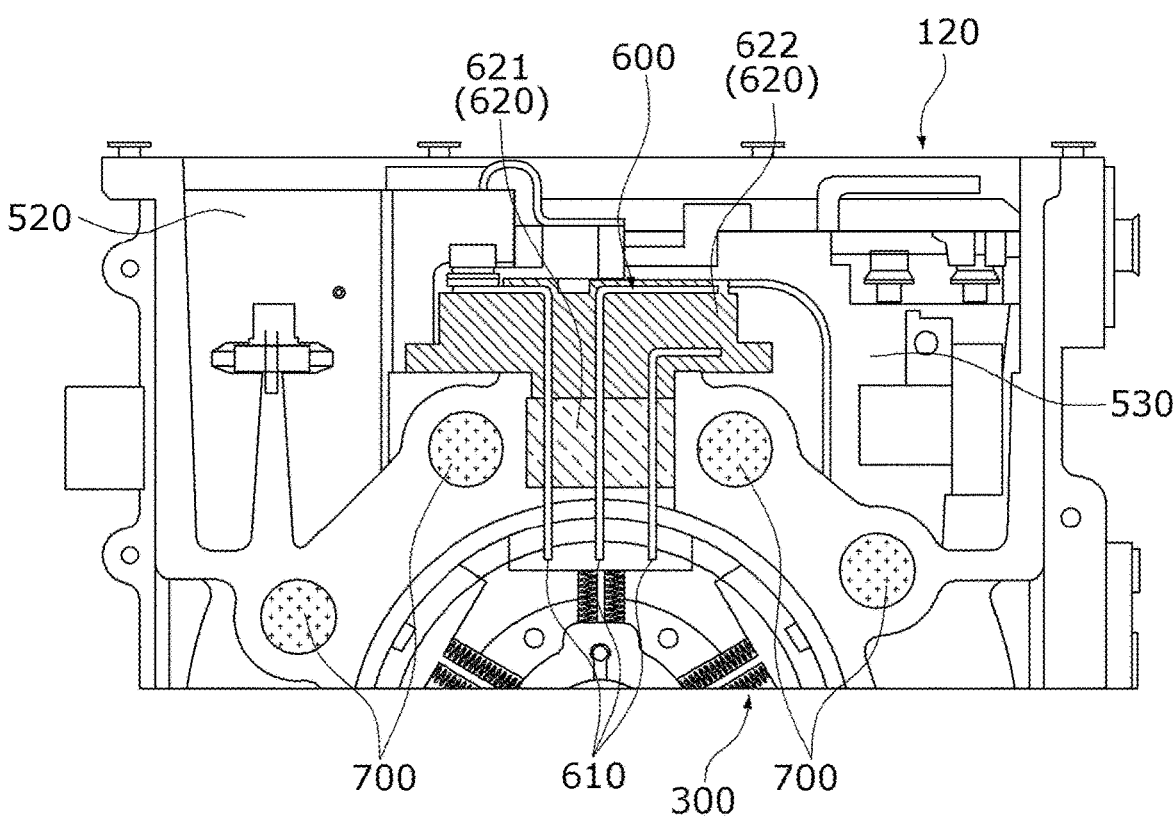
FIG. 3 is a partial cross-sectional view of an air compressor according to an embodiment of the present invention.

FIG. 2 is a plan view of a housing and a filter part according to an embodiment of the present invention, and FIG. 3 is a partial cross-sectional view of an air compressor according to an embodiment of the present invention.

Referring to FIGS. 2 and 3, the filter part 500 may include a transistor 510, a capacitor assembly 520 and a current sensor assembly 530.

The transistor 510 converts a Direct Current (DC) voltage into a driving voltage of the motor part 300 through a switching operation. The transistor 510 is disposed behind the second housing 120 and is connected to the control board 400. In this case, the transistor 510 may be an Insulated Gate Bipolar Transistor (IGBT).

The transistor 510 includes six IGBTs including a first phase (phase U) high switching element, a first phase (phase U) low switching element, a second phase (phase V) high switching element, a second phase (phase V) low switching element, a third phase (phase W) high switching element, and a third phase (phase W) low switching element. The transistor 510 is connected to a capacitor assembly 520 and a current sensor assembly 530.

The capacitor assembly 520 is electrically connected to an external power source and receives and stores high voltage DC current. In addition, the capacitor assembly 520 is electrically connected to the transistor 510 and the transfer module 600.

The current sensor assembly 530 detects a current transmitted to the motor part 300. The current sensor assembly 530 is electrically connected to the transistor 510 and the transfer module 600.

The transistor 510, capacitor assembly 520, and current sensor assembly 530 may be mounted on the second housing 120. In this case, the capacitor assembly 520 and the current sensor assembly 530 may be disposed in a first direction (X-axis direction). In addition, the transistor 510 may be disposed in a second direction (Y-axis direction) with respect to the capacitor assembly 520 and the current sensor assembly 530. In this case, the first direction (X-axis direction) and the second direction (Y-axis direction) may be perpendicular to each other, and the second direction (Y-axis direction) may be parallel to the axial direction.

The transfer module 600 connects the motor part 300 and the filter part 500. The transfer module 600 transfers power from the control board 400 to the motor part 300. In this case, the transfer module 600 may be electrically connected to the capacitor assembly 520 and the current sensor assembly 530. The transfer module 600 includes transfer units, at least one of the transfer units may be connected to the capacitor assembly 520, and at least one of the transfer units may be connected to the current sensor assembly 530.

The transfer module 600 may be spaced apart from the transistor 510 in the second direction (Y-axis direction) with the capacitor assembly 520 and the current sensor assembly 530 interposed therebetween. In this case, the transfer module 600 may pass through the second housing 120 and be connected to the motor part 300.

A through hole 120H in which the transfer module 600 is disposed may be formed in the second housing 120. The transfer module 600 may have one end connected to the motor part 300 and the other end connected to the filter part 500 based on the through hole 120H.

The air compressor having the above structure minimizes the thickness of the housing between the motor part 300 and the filter part 500 and compactly arranges the parts of the filter part 500 in the second housing 120, thereby reducing the size of the air compressor.

The transfer module 600 may include a transfer unit 610 and a fixing means 620.

The transfer unit 610 is electrically connected to the motor part 300. In this case, the transfer unit 610 supplies the AC voltage converted by the transistor 510 to the motor part 300. The transfer unit 610 may be provided as a plurality of transfer units 610. The plurality of transfer units 610 may include a U-phase bus bar 611 transmitting AC power of a first phase (phase U), a V-phase bus bar 612 transmitting AC power of a second phase (phase V), and a W-phase bus bar 613 transmitting AC power of a third phase (phase W).

The transfer units 610 may extend outward from the motor part 300 in a radial direction. In addition, the transfer units 610 may pass through the through hole 120H and may be bent toward the filter part 500. In this case, the U-phase bus bar 611 may be bent toward the capacitor assembly 520, and the V-phase bus bar 612 and W-phase bus bar 613 may be bent toward the current sensor assembly 530.

The ends of the U-phase bus bar 611, the V-phase bus bar 612, and the W-phase bus bar 613 may be exposed from the fixing means 620 in a state where the ends are spaced apart from each other. In this case, an end of at least one of the transfer units 610 may be connected to the capacitor assembly 520, and the remaining transfer units of the transfer units 610 may be connected to the current sensor assembly 530.

According to embodiments, since the ends of the transfer unit 610 are provided to branch in two directions, an assembly space can be secured between the transfer unit 610, the capacitor assembly 520, and the current sensor assembly 530, and thus assembly convenience can be improved.

The fixing means 620 fixes the transfer unit 610 to the housing 100 in a state where the transfer unit 610 is insulated. To this end, the fixing means 620 may include a grommet 621 and a guide member 622.

The grommet 621 is provided in through-hole 120H, and fixes the transfer unit 610 passing through-hole 120H. In this case, the grommet 621 may have elasticity and may be formed of an insulating material. Preferably, the grommet 621 may be formed of a rubber material.

The guide member 622 may guide each end of the transfer units 610 to the capacitor assembly 520 or the current sensor assembly 530. The guide member 622 may be formed of an insulating material. Preferably, the guide member 622 may be formed of a plastic material.

According to embodiments, the air compressor according to the present invention includes a plurality of cooling flow channels 700 that cool the motor part 300. The plurality of cooling flow channels 700 may extend parallel to an axial direction of the rotatory shaft (101 in FIG. 1). The plurality of cooling flow channels 700 may be embedded in the housing 100 and disposed between the motor part 300 and the filter part 500.

The plurality of cooling flow channels 700 may be disposed to be spaced apart from each other in the circumferential direction of the motor part 300 to surround at least one side of the motor part 300 and may absorb heat generated by the motor part 300. In this case, the plurality of cooling flow channels 700 may be disposed between the filter part 500 and the motor part and may absorb heat generated by the filter part 500.

The transfer module 600 may be disposed to pass between the plurality of cooling flow channels 700 spaced apart from each other. In this case, the plurality of cooling flow channels 700 may also absorb heat generated by the transfer unit 610 to prevent the transfer unit 610 from overheating.

Figure 4:
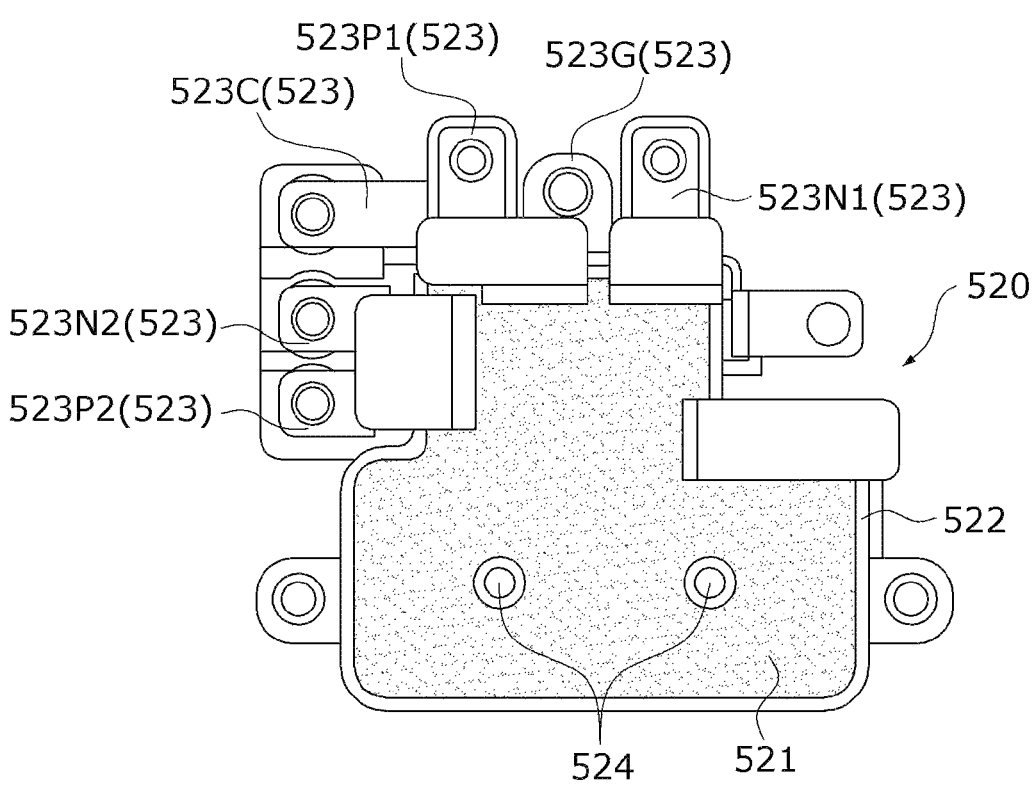
FIG. 4 is a plan view of a capacitor assembly according to an embodiment of the present invention.

FIG. 4 is a plan view of a capacitor assembly according to an embodiment of the present invention.

Referring to FIG. 4, the capacitor assembly 520 may include a capacitor 521, a case 522, a terminal part 523, and a resistor connection terminal 524.

The capacitor 521 may be a multilayer ceramic capacitor or a film capacitor.

The case 522 may support the capacitor 521. The case 522 may be fixed in the accommodating part of the second housing (120 in FIG. 2).

The terminal part 523 may be disposed on the case 522. In this case, the terminal part 523 and the case 522 may be integrally formed in an insert injection molding method.

The terminal part 523 may include a power output bus bar 523C. The power output bus bar 523C is electrically connected to the transfer module 600. The power output bus bar 523C may be integrally formed with the case 522 to ensure insulation, reduce the number of parts, and improve assemblability.

In addition, the terminal part 523 may include input terminals 523P1 and 523N1 connected to a connector part 800 to be described later, output terminals 523P2 and 523N2 connected to the transistor 510, and a ground terminal 523G grounded to the housing 100.

The resistor connection terminal 524 may be electrically connected to the discharge resistor 1000. The resistor connection terminal 524 may be connected to a terminal of a connecting member 1200 to be described later. Also, the resistor connection terminal 524 may be disposed on the capacitor 521.

Although not shown in the drawings, the resistor connection terminal 524 may be disposed on the case 522. Alternatively, it is also possible to connect the capacitor assembly 520 and the discharge resistor 1000 by connecting the terminal part 523 and the terminal of the connecting member 1200, and omit the resistor connection terminal 524.

Figure 5:
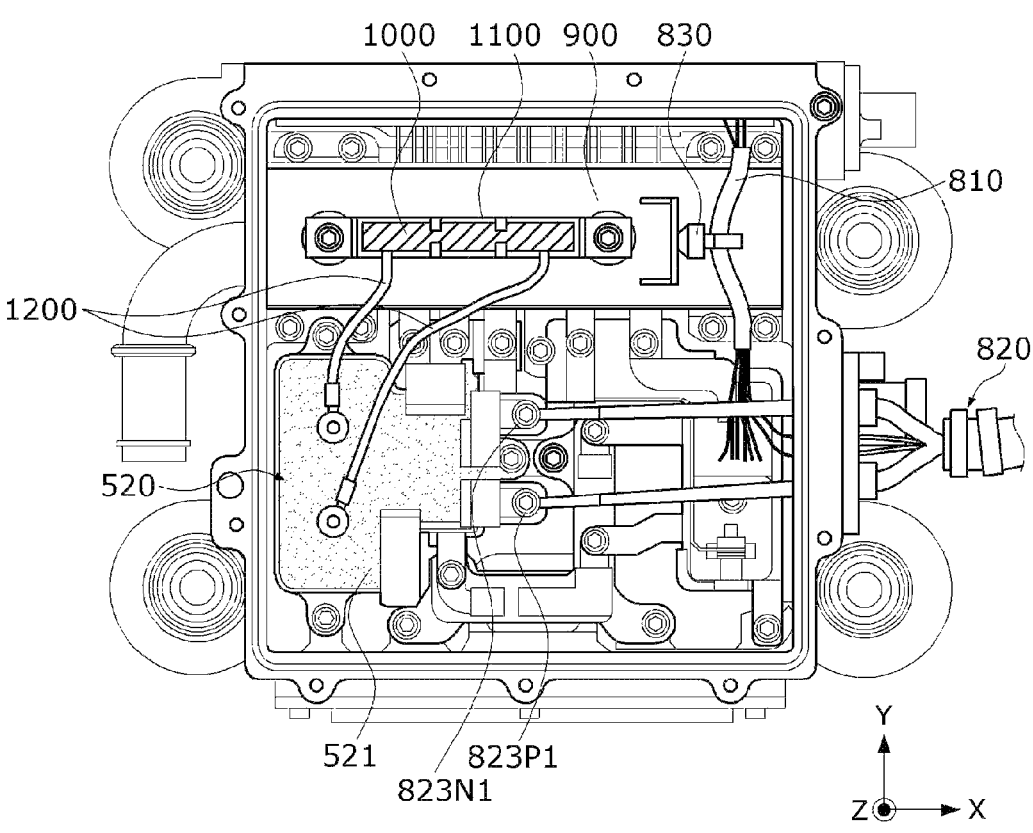
FIG. 5 is a plan view of an air compressor according to an embodiment of the present invention.
Figure 6:
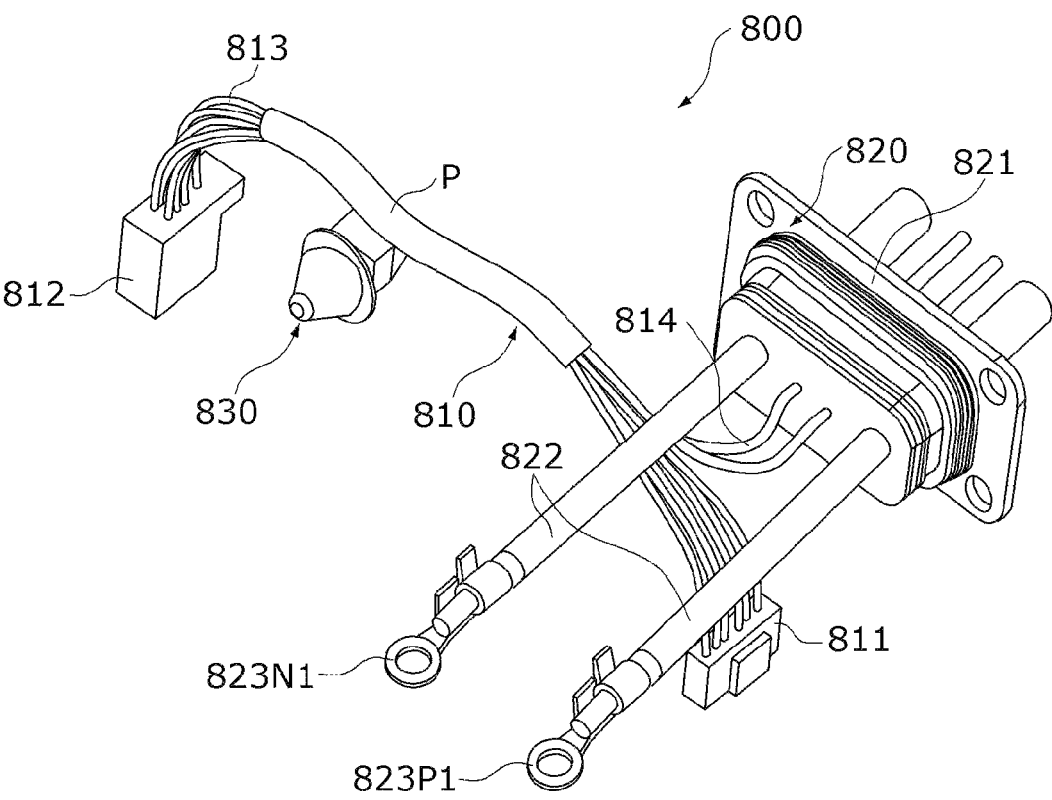
FIG. 6 is a perspective view of a connector part according to an embodiment of the present invention.
Figure 7:
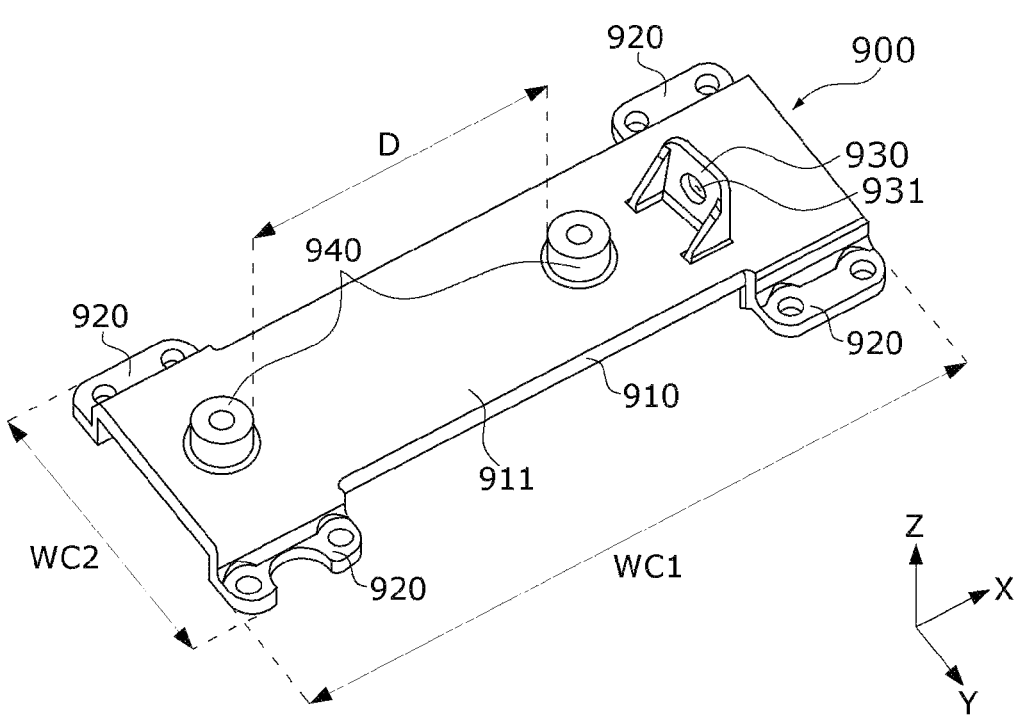
FIG. 7 is a perspective view of a cover according to an embodiment of the present invention.

FIG. 5 is a plan view of an air compressor according to an embodiment of the present invention, FIG. 6 is a perspective view of a connector part according to an embodiment of the present invention, and FIG. 7 is a perspective view of a cover according to an embodiment of the present invention.

Referring to FIGS. 5 and 6, the air compressor according to the present invention may include a connector part 800, a first cover 900, a discharge resistor 1000, a first fixing member 1100 and a connecting member 1200.

The connector part 800 may apply external power to the filter part 500 and transmit a signal sensed by the filter part 500 to the control board 400. The connector part 800 may include a first connector 810 and a second connector 820.

The first connector 810 electrically connects the control board 400 and the current sensor assembly 530. In addition, a portion of the first connector 810 is connected to the second connector 820 to check whether the second connector 820 and the capacitor assembly 520 are connected. To this end, the first connector 810 may include a first terminal 811, a second terminal 812, a first wire 813, and an interlock line 814.

The first terminal 811 is connected to the current sensor assembly 530, and the second terminal 812 is separated from the first terminal 811 and connected to the control board 400.

In this case, six first wires 813 may be provided and electrically connected to the first terminal 811 and the second terminal 812.

In this case, the plurality of first wires 813 may be bound using a band B. Further, the plurality of first wires 813 may be disposed to pass over the transistor 510. In this case, a fixing clip 830 is mounted on the transistor 510 to fix the movement of the plurality of first wires 813.

The interlock wire 814 may be electrically connected to the second terminal 812 and the second connector 820. In this case, the interlock wire 814 may be connected to an interlock pin (not shown) to be described later. The interlock wire 814 detects whether the second connector 820 is connected to an external power source.

The second connector 820 electrically connects the external power source and the capacitor assembly 520 to apply a high voltage DC current to the capacitor assembly 520. To this end, the second connector 820 may include a shielding member 821, a second cable 822, high voltage electrodes 823N1 and 823P1, and an interlock pin (not shown).

The shielding member 821 may be installed at one side of the housing 100. In this case, the shielding member 821 may be formed of an insulating material. The shielding member 821 may be coupled to the second cable 822 to fix the second cable 822 to the housing 100.

The second cable 822 may extend from the shielding member 821 toward the capacitor assembly 520. In this case, the second cables 822 may be provided as two second cables 822.

The high voltage electrodes 823N1 and 823P1 may be provided on the ends of the two second cables 822. In this case, the high voltage electrodes 823N1 and 823P1 may be connected to the input terminals 523P1 and 523N1 of the capacitor module 520.

The interlocking pins (not shown) may be embedded in shield member 821. In this case, an interlock pin (not shown) may be connected to the interlock cable.

The first cover 900 may be a cover for cooling the filter part 500. The first cover 900 may cover one side of the filter part 500 and absorb the heat generated from the filter part 500.

Accordingly, the first cover 900 may be made of a material having excellent thermal conductivity. According to embodiments, the first cover 900 may be made of at least one of aluminum, a synthetic resin material, and steel.

The first cover 900 may be disposed on the upper side of the filter part 500. Also, the first cover 900 may cover at least one side of the filter part 500 to absorb the heat generated from the filter part 500. According to an embodiment, the first cover 900 may be fixedly installed to the second housing in a state where it covers at least an upper side of the transistor 510. However, the first cover 900 is not limited thereto, and the position of the first cover 900 may be disposed anywhere in the filter part 500.

The discharge resistor 1000 may be connected to the capacitor assembly 520. The discharge resistor 1000 may discharge charges remaining in the capacitor assembly 520 when the capacitor assembly 520 is separated from the connector part 800. That is, when the supply of power from an external power is stopped, the discharge resistor 1000 discharges residual charge of the capacitor assembly 520 to prevent an electric shock accident.

The discharge resistor 1000 may be a separate object from the capacitor assembly 520. Also, the discharge resistor 1000 may be spaced apart from the capacitor assembly 520 in the second direction (Y-axis direction).

The discharge resistor 1000 may be disposed on the first cover 900. In this case, the discharge resistor 1000 may be overheated during long-term operation because a high-voltage current constantly flows. The first cover 900 may absorb the heat from the discharge resistor 1000 to prevent overheating.

The first fixing member 1100 may fix the discharge resistor 1000 to the first cover 900. The first fixing member 1100 may be coupled to the discharge resistor 1000 and disposed on an upper surface of the first cover 900.

The first fixing member 1100 may include a first fastening part 1110 and a first fixing part 1120. The first fastening part 1110 may come into contact with the first cover 900 and be fastened with the resistor fixing part 940 extending from the upper surface of the first cover 900. Also, the first fixing part 1120 may extend from the first fastening part 1110 to clamp the discharge resistor 1000. The first fastening part 1110 and the first fixing part 1120 are integrally formed and may be a member having elasticity.

Referring to FIG. 7, the first cover 900 may include a body 910, a fixing part 920, a connector fixing part 930, and a resistor fixing part 940.

The body 910 may be disposed on the transistor 510, and may cover at least a portion of a side surface and upper surface of the transistor 510. In this case, the body 910 may absorb heat generated by the transistor 510 and prevent the transistor 510 from overheating.

The fixing part 920 is in plural, and each fixing part 920 may extend from an edge of the body 910. The plurality of fixing parts 920 may be integrally formed with the body 910 and formed of the same material as the body 910. In this case, the plurality of fixing parts 920 may be coupled to the first housing (120 in FIG. 2) by coupling bolts.

The connector fixing part 930 may be disposed on an upper surface of the body 910. The connector fixing part 930 may fix the connector part 800 passing above the first cover 900. The connector fixing part 930 may protrude upward from the upper surface of the body 910, and a fixing hole 931 into which the fixing clip 830 is inserted may be formed in the connector fixing part 930. In this case, the end of the fixing clip 830 may be inserted into the fixing hole 931, so that the movement of the fixing clip 830 may be prevented.

The resistor fixing part 940 may be fastened to the discharge resistor 1000. More specifically, the resistor fixing part 940 may be fastened to the first fixing member 1100 for fixing the discharge resistor 1000.

The resistor fixing part 940 is plural, and the plurality of resistor fixing parts 420 may be spaced apart in the first direction (X-axis direction). In this case, the discharge resistor 1000 may be disposed between the plurality of resistor fixing parts 940 spaced apart from each other. In this case, a separation distance D between the plurality of resistor fixing parts 940 in the first direction (X-axis direction) may be greater than the width of the discharge resistor 1000.

The first cover 900 may be a rectangular member. The first cover 900 may have a width WC1 in the first direction (X-axis direction) greater than a width WC2 in the second direction (Y-axis direction).

Figure 8:
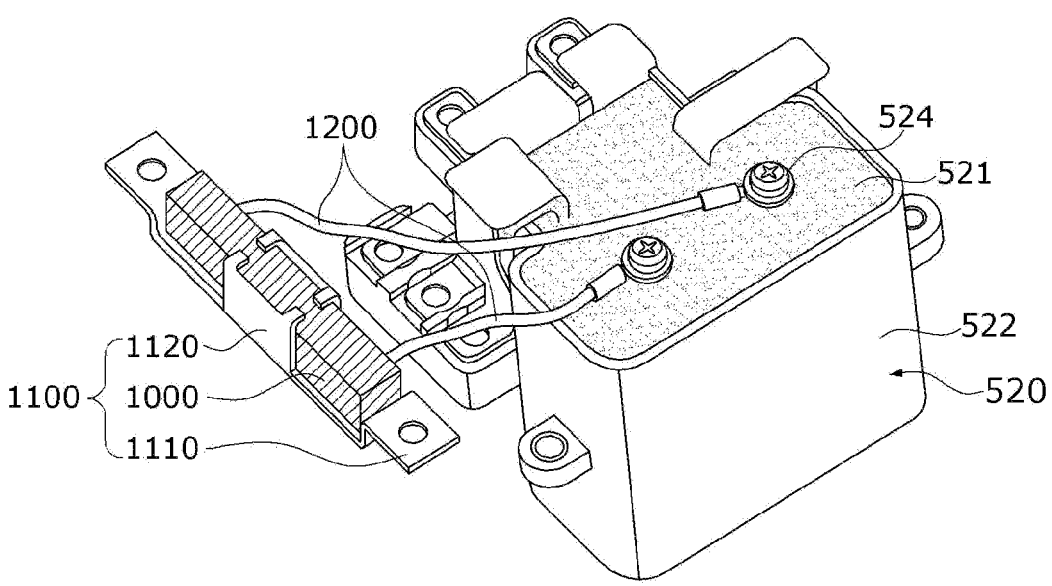
FIG. 8 is a perspective view of a capacitor assembly and a discharge resistor according to an embodiment of the present invention.
Figure 9:
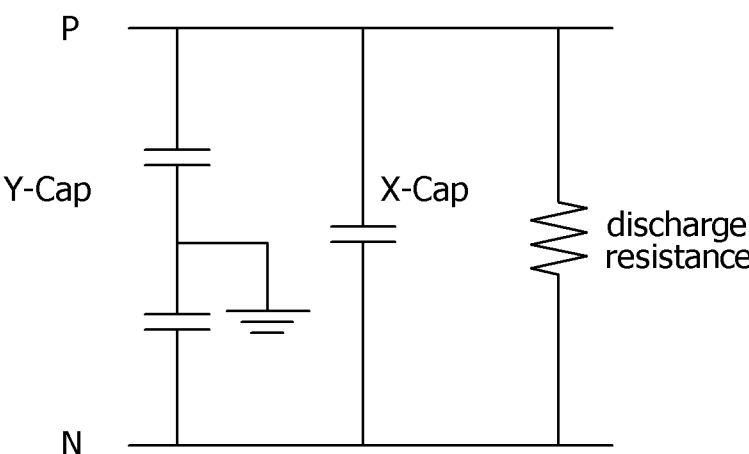
FIG. 9 is a circuit configuration view of a capacitor assembly and a discharge resistor according to an embodiment of the present invention.
Figure 10:
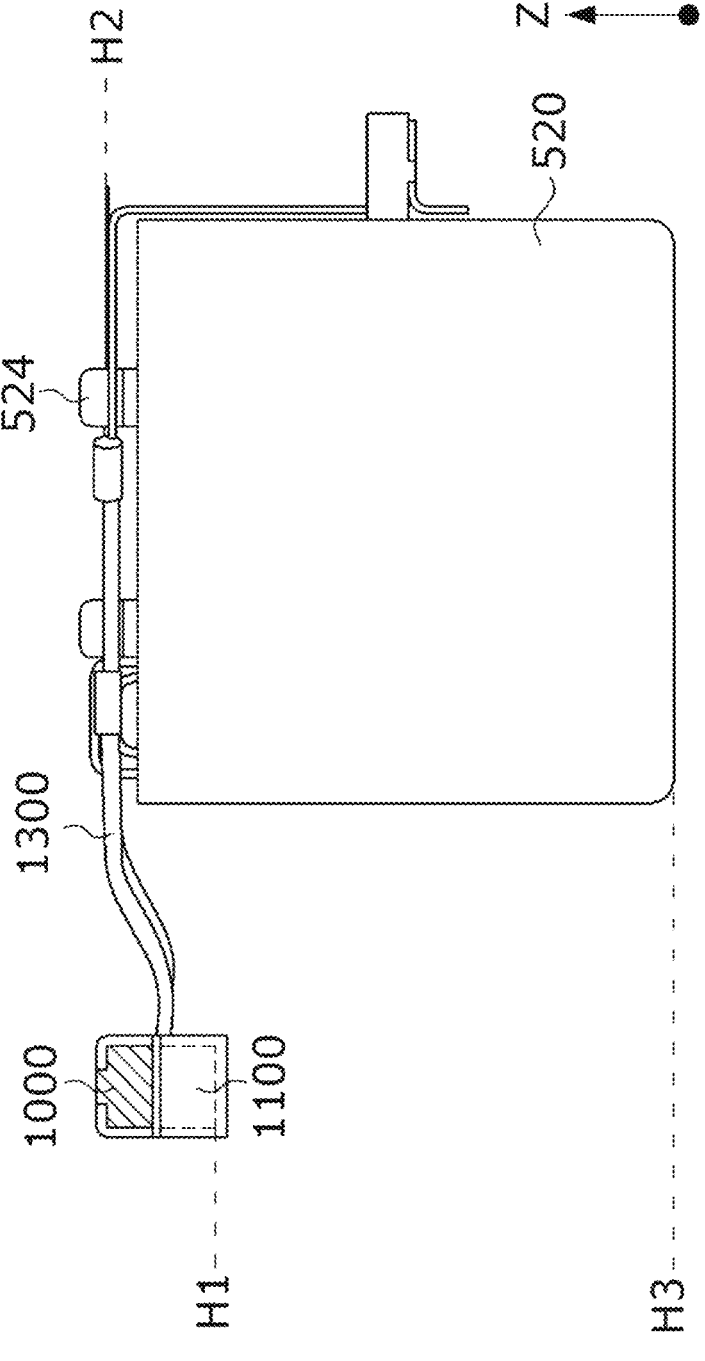
FIG. 10 is a view comparing a height difference between a capacitor assembly and a discharge resistor in a third direction according to an embodiment of the present invention.
Figure 11:
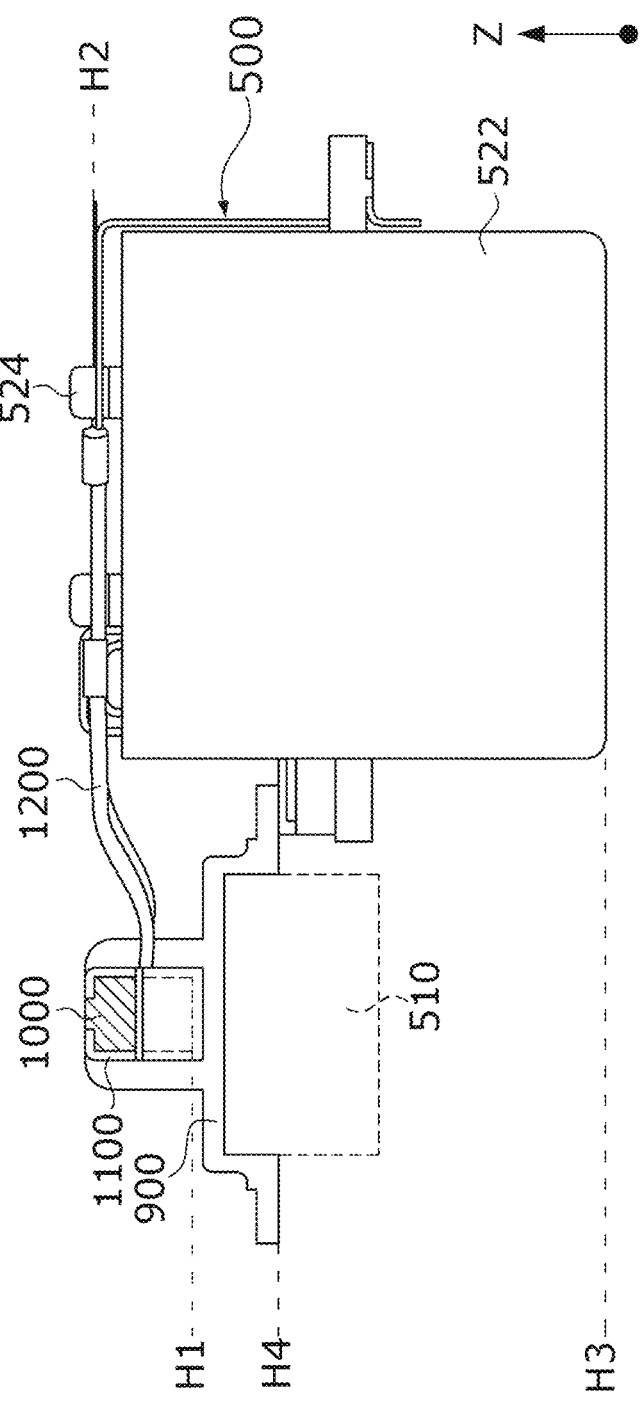
FIG. 11 is a view comparing a height difference between a capacitor assembly, a discharge resistor and a cover in a third direction according to an embodiment of the present invention.

FIG. 8 is a perspective view of the capacitor assembly and the discharge resistor according to an embodiment of the present invention, FIG. 9 is a circuit configuration view of the capacitor assembly and the discharge resistor according to an embodiment of the present invention, FIG. 10 is a view comparing a height difference between the capacitor assembly and the discharge resistor in a third direction according to an embodiment of the present invention, FIG. 11 is a view comparing a height difference between the capacitor assembly, the discharge resistor and the cover in the third direction according to an embodiment of the present invention.

Referring to FIGS. 8 to 11, the air compressor according to the present invention may further include a connecting member 1200 for electrically connecting the discharge resistor 1000 and the capacitor assembly 520. Also, the discharge resistor 1000 may be spaced apart from the capacitor assembly 520. In this case, by separating the discharge resistor 1000 and the capacitor assembly 520, the degree of freedom in design can be increased and the space can be used more compactly.

Referring to FIGS. 8 and 9, the height of the discharge resistor 1000 in the third direction (Z-axis direction) may be lower than the height of the upper surface of the capacitor assembly 520 in the third direction (Z-axis direction). Here, the height means a spaced distance in the third direction (Z direction) with respect to the lower surface of the capacitor assembly 520.

The height H1 of the lower surface of the discharge resistor 1000 may be lower than the height H2 of the resistor connection terminal 524. Also, the height H1 of the lower surface of the discharge resistor 1000 may be lower than the height of the upper surface of the capacitor assembly 520 and higher than the height H3 of the lower surface of the capacitor assembly 520.

Similarly, the height H4 of the lower end of the first cover 900 may be lower than the height H2 of the resistor connection terminal 524. Also, the height H4 of the lower end of the first cover 900 may be lower than the height of the upper surface of the capacitor assembly 520 and higher than the height H3 of the lower surface of the capacitor assembly 520. The transistor 510 may be disposed under the first cover 900.

In the air compressor according to the present invention, since the discharge resistor is disposed lower than the capacitor assembly, there is no protruding portion, interference between parts can be reduced, and space utilization around the filter part can be increased.

Figure 12:
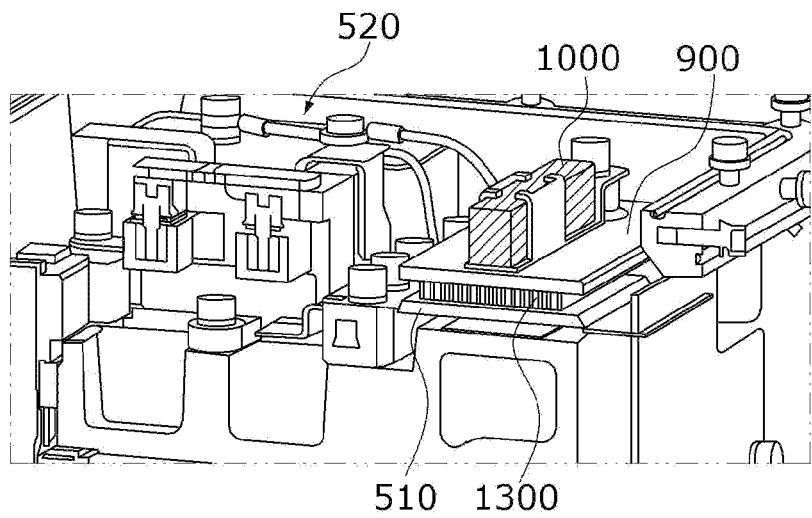
FIG. 12 is a view showing a portion of a filter part according to an embodiment of the present invention.

FIG. 12 is a view showing a portion of a filter part according to an embodiment of the present invention.

Referring to FIG. 12, the air compressor may further include a heat exchanging means 1300 disposed between the first cover 900 and the transistor 510 to increase cooling efficiency.

The heat exchanging means 1300 is connected to the transistor 510 in a heat exchange manner, and may be heated by the heat generated by the transistor 510 or cooled together with the transistor 510.

The heat exchanging means 1300 may be in direct contact and exchange heat through conduction, but is not limited thereto. Also, the first cover 900 may be disposed on the upper side of the heat exchanging means 1300. Also, the discharge resistor 1000 may be disposed on an upper side of the first cover 900.

In this way, the transistor 510 can be cooled more effectively by further providing the heat exchanging means 1300 between the first cover 900 and the transistor 510, so that the cooling efficiency of the discharge resistor 1000 disposed on the upper side of the first cover 900 may also be increased.

Referring back to FIG. 12, the heat exchanging means 1300 may be integrally provided with the first cover 900.

Since the first cover 900 is disposed on the upper side of the heat exchanging means 1300, a phenomenon in which the first cover 900 is shaken even by vibration caused by an external force in a state where the first cover 900 and the heat exchanging means 1300 are integrally provided can be reduced. The first cover 900 and the heat exchanging means 1300 may be integrally formed through an adhesive member such as an adhesive or may be integrally formed through injection molding.

Hereinafter, an air compressor according to another embodiment will be described with reference to FIG. 13.

Figure 13:
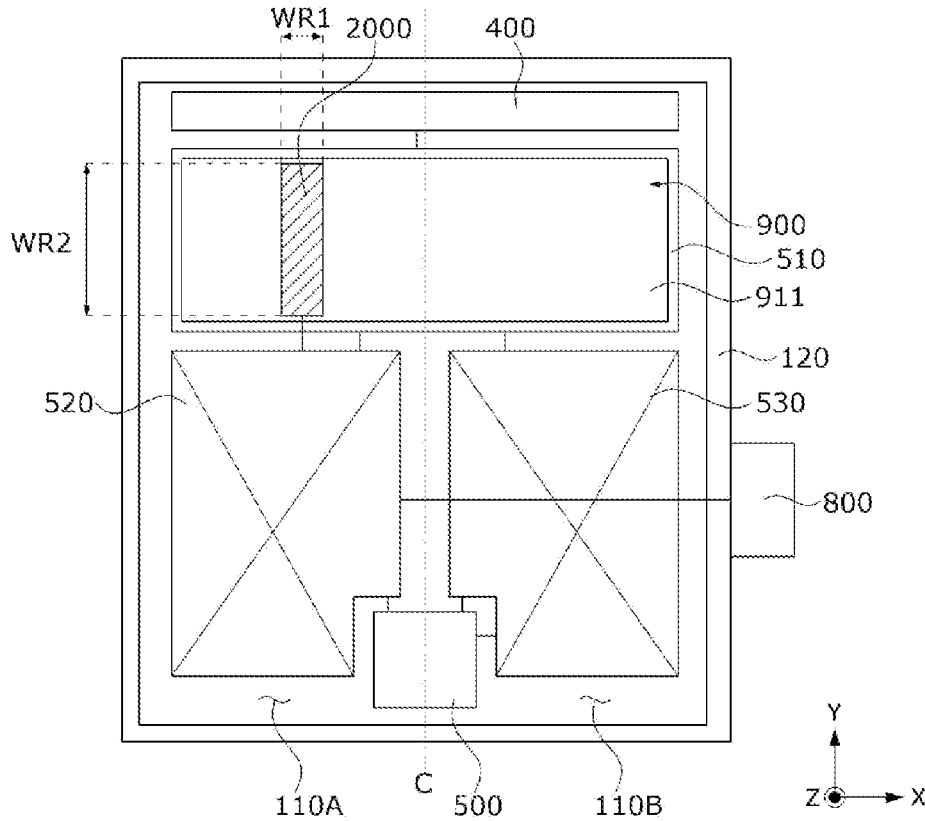
FIG. 13 is a plan view schematically showing an air compressor according to another embodiment of the present invention.

FIG. 13 is a plan view schematically showing an air compressor according to another embodiment of the present invention.

This embodiment is substantially the same as the air compressor shown in FIG. 5 except for the position of the discharge resistor. Therefore, the same reference numerals are assigned to the same components as those in FIG. 5, and repetitive descriptions are omitted.

Referring to FIG. 13, the air compressor according to the present invention may include a capacitor assembly 520 and a discharge resistor 2000 electrically connected to the discharge assembly 520.

The discharge resistor 2000 is a rectangular member and may be disposed in the first direction (Y-axis direction). That is, the width WR1 of the discharge resistor 2000 in the first direction (X-axis direction) may be smaller than the width WR2 in the second direction (Y-axis direction). The discharging resistor 2000 arranged in this way can reduce interference with the filter part, and since it is arranged parallel to the flow direction of a cooling flow channel (700 in FIG. 3), heat can be discharged smoothly.

The inner space of the second housing 120 may be divided into a first space 120A and a second space 120B based on an arbitrary imaginary line C extending in the second direction. In this case, the virtual line C may pass through the transfer module 600. The capacitor assembly 520 may be disposed in the first space 120A, and the current sensor assembly 530 may be disposed in the second space 120B. In this case, the discharge resistor 2000 may be disposed in the first space 120A.

In one embodiment, although not shown in the drawings, the discharge resistor 1000 may be disposed adjacent to the current sensor assembly 530. The discharge resistor 1000 may be coupled to the current sensor assembly 530.

In one embodiment, although not shown in the drawing, the discharge resistor 1000 may be disposed adjacent to the transfer module 600. The discharge resistor 1000 may be coupled to the fixing means (620 in FIG. 3).

In one embodiment, although not shown in the drawing, the discharge resistor 1000 may be coupled to the second housing 120. In this case, the second housing 120 has an accommodating part in which the filter part 500 is disposed, and the discharge resistor 1000 may be mounted in the accommodating part. In this case, the air compressor may further include a second fixing member fixing the discharge resistor 1000 to the upper surface of the second housing 120.

In the air compressor according to the present invention, interference between the filter part 500 and the discharge resistor 1000 is reduced by improving the arrangement structure between the filter part 500 and the discharge resistor 1000, and the air compressor can be made compact by increasing space utilization of the filter part 500.

In addition, overheating of the discharge resistor 1000 is prevented by disposing the discharge resistor 1000 on the upper surface of the first cover 900 or at a location where heat is easily discharged, and the problem of the temperature around the filter part 500 rising can be solved.

Hereinafter, an air compressor according to another embodiment will be described with reference to FIGS. 14 to 20.

Figure 14:
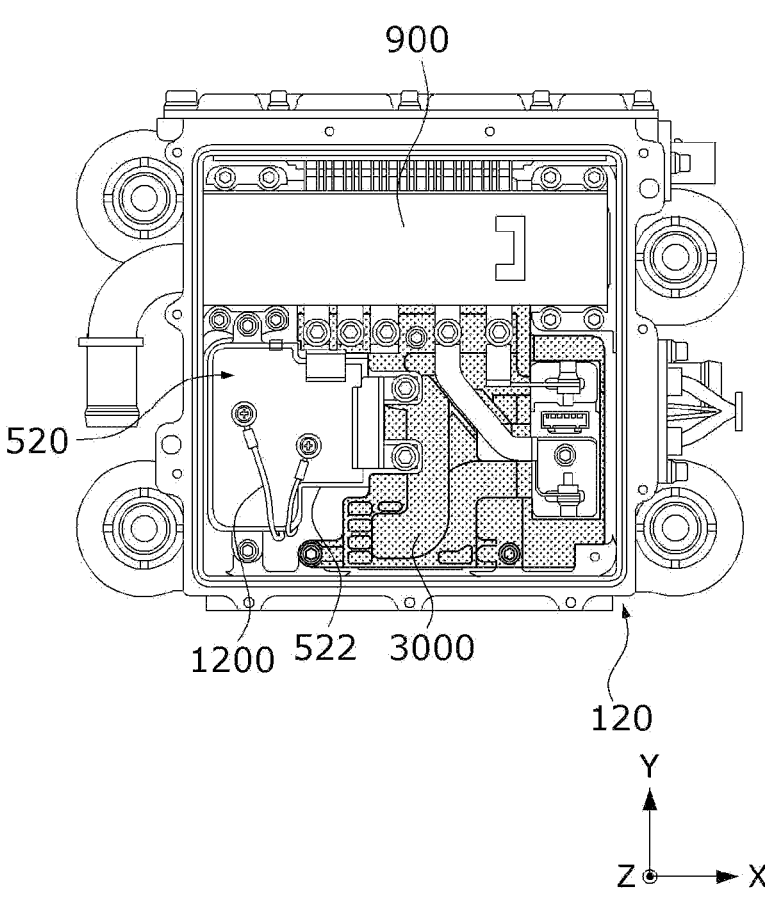
FIG. 14 is a plan view of an air compressor according to another embodiment of the present invention.
Figure 15:
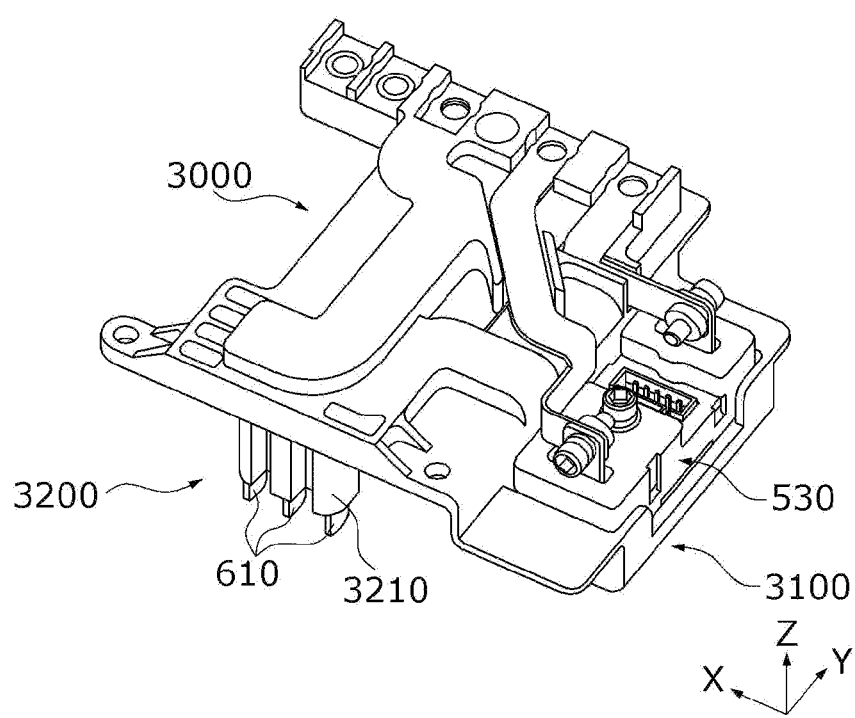
FIG. 15 is a perspective view of a cover according to another embodiment of the present invention.
Figure 16:
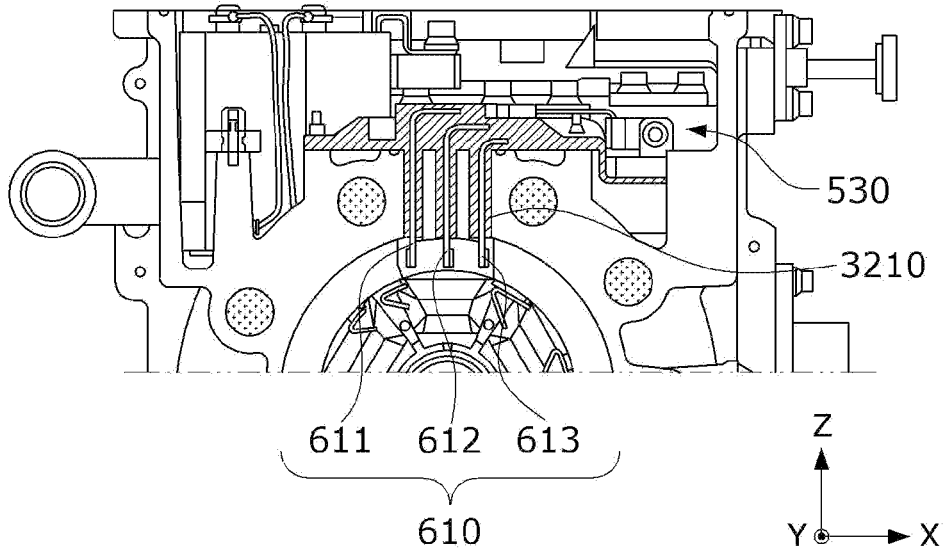
FIG. 16 is a partial cross-sectional view of an air compressor according to another embodiment of the present invention.
Figure 17:
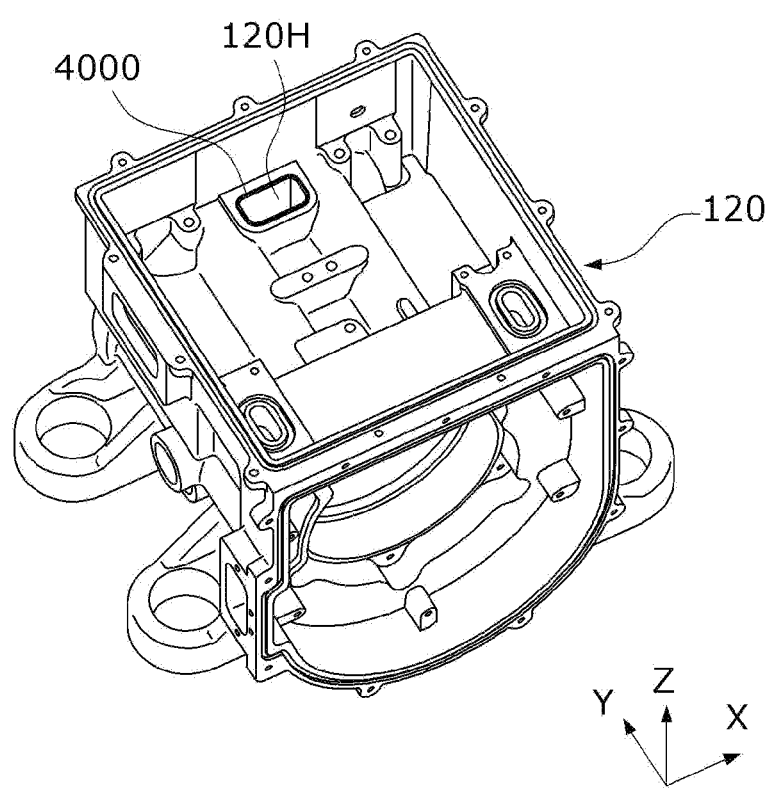
FIG. 17 is a perspective view of a second housing according to another embodiment of the present invention.
Figure 18:
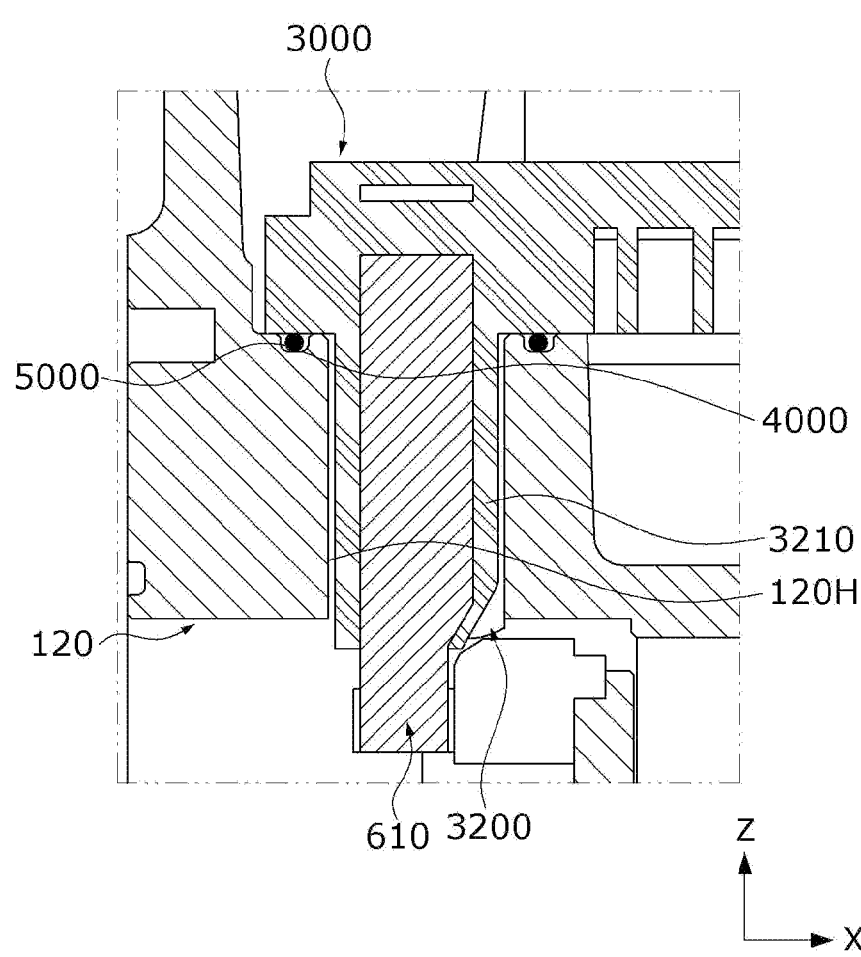
FIG. 18 is a cross-sectional view showing a portion where a cover is coupled to a second housing according to another embodiment of the present invention.
Figure 19:
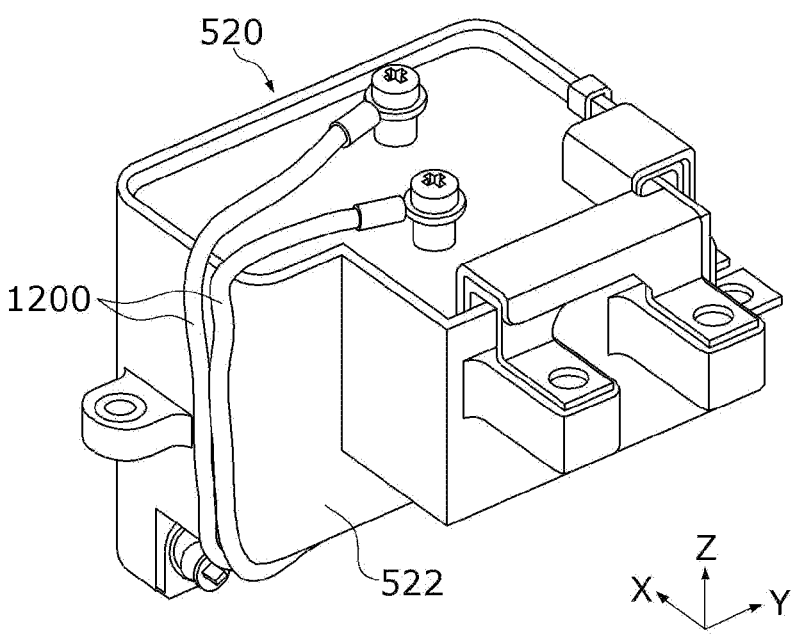
FIG. 19 is a perspective view showing a discharge resistor coupled to a capacitor assembly according to another embodiment of the present invention.
Figure 20:
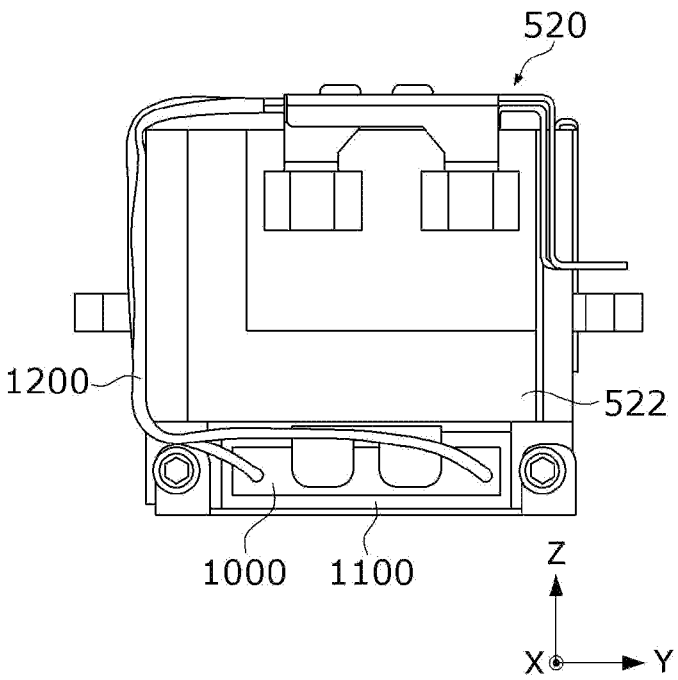
FIG. 20 is a front view showing a discharge resistor coupled to a capacitor assembly according to another embodiment of the present invention.

FIG. 14 is a plan view of an air compressor according to another embodiment of the present invention, FIG. 15 is a perspective view of a cover according to another embodiment of the present invention, FIG. 16 is a partial cross-sectional view of an air compressor according to another embodiment of the present invention, FIG. 17 is a perspective view of a second housing according to another embodiment of the present invention, FIG. 18 is a cross-sectional view showing a portion where a cover is coupled to a second housing according to another embodiment of the present invention, FIG. 19 is a perspective view showing a discharge resistor coupled to a capacitor assembly according to another embodiment of the present invention, and FIG. 20 is a front view showing a discharge resistor coupled to a capacitor assembly according to another embodiment of the present invention.

The air compressor of the embodiment shown in FIGS. 14 to 20 is substantially the same as the air compressor shown in FIG. 5. Therefore, the same reference numerals are assigned to the same components as those in FIG. 5, and repetitive descriptions are omitted.

Referring to FIGS. 14 to 18, an air compressor according to another embodiment of the present invention may include a second cover 3000.

The second cover 3000 may be disposed inside the second housing 120. The second cover 3000 may be disposed on one side of the capacitor assembly 520 along the first direction (X-axis direction) inside the second housing 120. In addition, the second cover 3000 may be disposed on one side of the first cover 900 along the second direction (Y-axis direction) inside the second housing 120. That is, the second cover 3000 may cover the inside of the second housing 120 that is not covered by the capacitor assembly 520 and the first cover 900.

The second cover 3000 may include a first support part 3100 and a second support part 3200.

The first support part 3100 may be disposed on one side of the second cover 3000 along the first direction (X-axis direction). The first support part 3100 may support the current sensor assembly 530. The first support part 3100 may have a shape corresponding to the shape of the current sensor assembly 530 to support the current sensor assembly 530, but is not limited thereto.

The second support part 3200 may support the transfer unit 610. More specifically, the second support part 3200 may support the U-phase bus bar 611 transmitting AC power of a first phase (phase U), the V-phase bus bar 612 transmitting AC power of a second phase (phase V), and the W-phase bus bar 613 transmitting AC power of a third phase (phase W), respectively. In this case, each of the bus bars 611, 612, and 613 may have a shape bent toward the current sensor assembly 530, as shown in FIG. 15. Since each of the bus bars 611, 612, and 613 is bent in the same direction, convenience of assembly is improved and assembly time can be reduced.

The second support part 3200 may include a protruding part 3210 protruding in the third direction (Z-axis direction) along the shape of the transfer unit 610. A portion of the transfer unit 610 may protrude outward from the second cover 3000 along the third direction (Z-axis direction) in a state where it is supported by the second cover 3000. The protruding part 3210 may surround a portion protruding outward of the second cover 3000 of the transfer unit 610.

The protruding part 3210 may be accommodated in the through hole 120H of the second housing 120 shown in FIGS. 17 and 18. The protruding part 3210 may have a thickness corresponding to a distance between one surfaces of the second housing 120 forming the through hole 120H. As a result, the gap between the outer surface of the protruding part 3210 and the surface of the second housing 120 forming the through hole 120H is suppressed, so that the transfer unit 610 can be stably maintained by the protruding part 3210.

In addition, in the air compressor according to the present invention, since the second cover 3000 supports the U-phase, V-phase, and W-phase bus bars 611, 612, and 613, the amount of fastening members such as bolts used to support the U-phase, V-phase, and W-phase bus bars 611, 612 and 613 is reduced, so the cost and assembly time required to manufacture the air compressor can be saved.

In addition, since in the air compressor according to the present invention, the second cover 3000 covers an area in the second housing 120 that cannot be covered by the capacitor assembly 520 and the first cover 900, inflow of a fastening member or the like into the second housing 120 due to a worker's mistake can be prevented.

In addition, in the air compressor according to the present invention, since the second cover 3000 simultaneously supports the current sensor assembly 530 and the transfer unit 610, the process of double injection of the cover for supporting each component can be omitted. As a result, the cost can be reduced, and the consumption of assembly cost and assembly time can be reduced.

Referring to FIGS. 16 to 18 again, an air compressor according to another embodiment of the present invention may include a groove 4000 disposed inside the second housing 120 and a seal ring 5000 disposed in the groove 4000.

The groove 4000 may be disposed adjacent to the through hole 120H disposed inside the second housing 120. The groove 4000 may be spaced apart from the through hole 120H. The groove 4000 may be formed in a square ring shape along one surface of the second housing 120 forming the through hole 120H, but is not limited thereto. The groove 4000 may be formed along the third direction (Z-axis direction) on one surface of the second housing 120. When the second cover 3000 is disposed inside the second housing 120, the open upper side of the groove 4000 may be covered by the second cover 3000.

The sealing 5000 may be disposed in groove 4000. The sealing 5000 may be formed to have a circular cross section. A portion of the sealing 5000 may be pressed by the second cover 3000. When the second cover 3000 is disposed on the second housing 120 and covers the upper side of the groove 4000, the sealing 5000 may keep an airtight seal between the coupling surface of the second cover 3000 and the coupling surface of the groove 4000. Accordingly, inflow of foreign substances into the second housing 120 may be prevented.

In addition, the sealing 5000 may prevent hot air generated from the air compressor from entering an inverter (not shown) that supplies power to the motor part 300. Accordingly, performance of the inverter (not shown) may be maintained, and power may be stably supplied to the motor part 300 through the inverter (not shown).

Although the shape of the seal ring 5000 is illustrated as circular in this embodiment, it is not limited thereto, and the shape of the seal ring 5000 may be provided in a polygonal shape such as a square shape or a pentagon shape.

Referring to FIGS. 14 and 19 to 20, the discharge resistor 1000 and the first fixing member 1100 according to another embodiment of the present invention may be disposed below the case 522 of the capacitor assembly 520.

More specifically, the discharge resistor 1000 may be coupled to the first fixing member 1100 and fixed to the lower side of the case 522 by the first fixing member 1100. In this case, the discharge resistor 1000 may be disposed on the lower side of the case 522 along the second direction (Y direction). The discharge resistor 1000 through which high-voltage current flows may be cooled by cooling water flowing inside the second housing 120.

The discharge resistor 1000 and the first fixing member 1100 according to the present embodiment may be integrally provided in the case 522 of the capacitor assembly 520.

As the discharge resistor 1000 is disposed on the lower side of the case 522, the connecting member 1200 for electrically connecting the discharge resistor 1000 and the capacitor assembly 520 may be wound along the outer surface of the case 520.

Although the above description has been made with reference to the preferred embodiments of the present invention, those skilled in the art will understand that the present invention can be variously changed and modified within the scope not departing from the spirit and scope of the present invention described in the claims below.

DESCRIPTION OF REFERENCE NUMERALS

100: housing, 200: compression part, 300: motor part, 400: control board, 500: filter part, 600: transfer module, 620: fixing means, 700: cooling flow channel, 800: connector part, 900: first cover, 1000,2000: discharge resistor, 1100: first fixing member, 1200: connecting member

What is claimed is:

1. An air compressor comprising:
a housing;
a rotary shaft disposed inside the housing;
a compression part that is connected to the rotary shaft and compresses and discharges introduced air;
a motor part that drives the rotary shaft;
a control board that controls the motor part; and
a filter part that filters noise of external power and supplies the external power to the control board,
wherein the filter part includes:
a capacitor assembly connected to an external power source;
a transistor connected to the control board;
a current sensor assembly connected to the transistor;
a first cover disposed to cover at least one side of the filter part;
a heat exchanger disposed between the first cover and the transistor; and
a discharge resistor that is connected to the capacitor assembly and discharges residual charge in the capacitor assembly.

2. The air compressor of claim 1, further comprising a transfer module that transfers power from the control board to the motor part, wherein the discharge resistor is disposed adjacent to the transfer module, the transfer module includes a transfer unit extending outward in a radial direction from the motor part.

3. The air compressor of claim 2, wherein the capacitor assembly includes:
a capacitor;
a case supporting the capacitor; and
a resistor connection terminal connected to the discharge resistor,
wherein the resistor connection terminal is disposed on the capacitor.

4. The air compressor of claim 3, wherein the current sensor assembly and the capacitor assembly are disposed in a first direction perpendicular to an axial direction, the transistor is disposed in a second direction perpendicular to the first direction with respect to the current sensor assembly and the capacitor assembly.

5. The air compressor of claim 4, comprising at least one cooling flow channel disposed between the motor part and the filter part, wherein the discharge resistor is disposed adjacent to the cooling flow channel.

6. The air compressor of claim 1, wherein the first cover is disposed on an upper side of the transistor, and the discharge resistor is disposed on an upper surface of the first cover.

7. The air compressor of claim 6, comprising a fixing member coupled to the discharge resistor and disposed on the upper surface of the first cover to fix the discharge resistor to the first cover.

8. The air compressor of claim 6, wherein the discharge resistor is disposed adjacent to the current sensor assembly.

9. The air compressor of claim 1, wherein the first cover is disposed such that a width in a first direction is longer than a width in a second direction, the discharge resistor is disposed such that the width in the first direction is longer than the width in the second direction.

10. The air compressor of claim 9, wherein one surface of the first cover to which the discharge resistor is fixed is disposed lower than the resistor connection terminal.

11. The air compressor of claim 4, wherein an inner space of the housing is divided into a first space in which the capacitor assembly is disposed and a second space in which the current sensor assembly is disposed, based on an imaginary line extending in an axial direction, the discharge resistor is disposed in the first space.

12. The air compressor of claim 1, wherein the first cover is made of at least one of aluminum, synthetic resin and steel.

13. The air compressor of claim 1, wherein the first cover and the heat exchanger are integrally provided.

14. An air compressor comprising:
a housing;
a rotary shaft disposed inside the housing;
a compression part that is connected to the rotary shaft and compresses and discharges introduced air;
a motor part that drives the rotary shaft;
a control board that controls the motor part;
a filter part that filters noise of external power and supplies the external power to the control board,
wherein the filter part includes:
a capacitor assembly connected to an external power source;
a transistor connected to the control board;
a current sensor assembly connected to the transistor; and
a discharge resistor that is connected to the capacitor assemble and discharges residual charge in the capacitor assembly,
a transfer module that transfers power from the control board to the motor part, wherein the discharge resistor is disposed adjacent to the transfer module, the transfer module includes a transfer unit extending outward in a radial direction from the motor part,
wherein the capacitor assembly includes:
a capacitor;
a case supporting the capacitor; and
a resistor connection terminal connected to a discharge resistor, wherein the resistor connection terminal is disposed on the capacitor,
wherein the current sensor assembly and the capacitor assembly are disposed in a first direction perpendicular to an axial direction, the transistor is disposed in a second direction perpendicular to the first direction with respect to the current sensor assembly and the capacitor assembly wherein an inner space of the housing is divided into a first space in which the capacitor assembly is disposed and a second space in which the current sensor assembly is disposed, based on an imaginary line extending in an axial direction, the discharge resistor is disposed in the first space, wherein the discharge resistor is disposed on a lower side of the case.

15. An air compressor comprising:

a housing;

a rotary shaft disposed inside the housing;

a compression part that is connected to the rotary shaft and compresses and discharges introduced air;

a motor part that drives the rotary shaft;

a control board that controls the motor part;

a filter part that filters noise of external power and supplies the external power to the control board, wherein the filter part includes:

a capacitor assembly connected to an external power source;

a transistor connected to the control board;

a current sensor assembly connected to the transistor; and a discharge resistor that is connected to the capacitor assemble and discharges residual charge in the capacitor assembly, a transfer module that transfers power from the control board to the motor part, wherein the discharge resistor is disposed adjacent to the transfer module, the transfer module includes a transfer unit extending outward in a radial direction from the motor part; and a second cover disposed in the housing, wherein the second cover includes:

a first support part supporting the current sensor assembly and a second support part supporting the transfer unit, wherein the capacitor assembly includes:

a capacitor;

a case supporting the capacitor; and a resistor connection terminal connected to a discharge resistor, wherein the resistor connection terminal is disposed on the capacitor.

16. The air compressor of claim 15, wherein the second support part includes a protruding part surrounding a portion of the transfer unit, and the housing further includes a through hole accommodating the protruding part.

17. The air compressor of claim 15, wherein the housing further includes a groove spaced apart from the through hole, a sealing is disposed inside the groove, when the second cover is disposed inside the housing, an upper side of the groove and the sealing are covered by the second cover.

* * * * *